United States Patent
Akutsu et al.

(10) Patent No.: US 9,293,573 B2
(45) Date of Patent: Mar. 22, 2016

(54) NITRIDE SEMICONDUCTOR DEVICE AND MANUFACTURING METHOD THEREOF

(71) Applicant: ROHM CO., LTD., Kyoto (JP)

(72) Inventors: Minoru Akutsu, Kyoto (JP); Tetsuya Fujiwara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 13/899,107

(22) Filed: May 21, 2013

(65) Prior Publication Data

US 2013/0313609 A1    Nov. 28, 2013

(30) Foreign Application Priority Data

May 24, 2012  (JP) ................................ 2012-118826

(51) Int. Cl.

| | |
|---|---|
| H01L 29/66 | (2006.01) |
| H01L 29/78 | (2006.01) |
| H01L 29/51 | (2006.01) |
| H01L 29/778 | (2006.01) |
| H01L 29/43 | (2006.01) |
| H01L 29/20 | (2006.01) |

(52) U.S. Cl.
CPC .............. *H01L 29/78* (2013.01); *H01L 29/513* (2013.01); *H01L 29/517* (2013.01); *H01L 29/518* (2013.01); *H01L 29/66462* (2013.01); *H01L 29/66477* (2013.01); *H01L 29/7786* (2013.01); *H01L 29/2003* (2013.01); *H01L 29/432* (2013.01)

(58) Field of Classification Search
CPC ..... H01L 29/78; H01L 29/778; H01L 29/513; H01L 29/518; H01L 29/66462; H01L 29/66477; H01L 29/7786

USPC ............................ 257/192, E29.091; 438/285
See application file for complete search history.

(56) References Cited

U.S. PATENT DOCUMENTS

2009/0189187 A1* 7/2009 Briere et al. .................. 257/192
2010/0314663 A1* 12/2010 Ito et al. ........................ 257/192

(Continued)

FOREIGN PATENT DOCUMENTS

JP       2008-103408 A      5/2008

OTHER PUBLICATIONS

Karmalkar et al. Enhancement of Breakdown Voltage in AlGaN/GaN High Electron Mobility Transistors Using a Field Plate. IEEE Transactions on Electron Devices, vol. 48, No. 8, Aug. 2001.*

*Primary Examiner* — Matthew Landau
*Assistant Examiner* — Eric Ashbahian
(74) *Attorney, Agent, or Firm* — Chen Yoshimura LLP

(57) ABSTRACT

Provided are a nitride semiconductor device having an excellent boundary between a nitride semiconductor and a gate insulating film, resulting in improved device characteristics, and a manufacturing method therefor. The nitride semiconductor device includes: an electron transport layer made of a nitride semiconductor; an electron supply layer layered on the electron transport layer, the electron supply layer being made of a nitride semiconductor including Al and having an Al composition different from that of the electron transport layer; a source electrode and a drain electrode formed on the electron supply layer with a gap therebetween; a gate insulating film covering the surface of the electron supply layer between the source electrode and the drain electrode; a passivation film covering a surface of the gate insulating film and having an opening between the source electrode and the drain electrode; and a gate electrode having a main gate body in the opening facing the electron supply layer through the gate insulating film.

19 Claims, 10 Drawing Sheets

(56) References Cited

U.S. PATENT DOCUMENTS

| | | | |
|---|---|---|---|
| 2010/0320505 A1* | 12/2010 | Okamoto et al. | 257/192 |
| 2011/0089430 A1* | 4/2011 | Kikkawa | 257/76 |
| 2012/0056191 A1* | 3/2012 | Endo et al. | 257/76 |
| 2012/0273795 A1* | 11/2012 | Li | 257/76 |
| 2013/0140605 A1* | 6/2013 | Ramdani et al. | 257/192 |
| 2013/0146943 A1* | 6/2013 | Edwards et al. | 257/192 |

\* cited by examiner

NITRIDE SEMICONDUCTOR DEVICE AND MANUFACTURING METHOD THEREOF

This application claims the benefit of Japanese Application No. 2012-118826, filed in Japan on May 24, 2012, which is hereby incorporated by reference in its entirety.

BACKGROUND OF THE INVENTION

1. Field of the Invention

The present invention relates to a semiconductor device made of a group III nitride semiconductor (sometimes referred to simply as a "nitride semiconductor" below) and a manufacturing method therefor.

2. Description of Related Art

A group III nitride semiconductor is a semiconductor that uses nitrogen as the group V element in a group III-V semiconductor. Aluminum nitride (AlN), gallium nitride (GaN), and indium nitride (InN) are representative examples thereof. In general, it is possible to express this as $Al_X In_Y Ga_{1-X-Y} N$ ($0 \leq X \leq 1$, $0 \leq Y \leq 1$, $0 < X+Y < 1$).

A MISFET (metal-insulator-semiconductor field effect transistor) using such a nitride semiconductor is proposed. Patent Document 1 discloses one example of such a MISFET. The MISFET disclosed in Patent Document 1 has a layered configuration including a GaN layer and an AlGaN layer, and an interlayer insulating layer is formed on the AlGaN layer. The interlayer insulating layer has an opening that exposes the surface of the AlGaN layer, and a gate insulating layer is disposed in this opening. A gate electrode is formed on the gate insulating layer. The gate insulating layer has a multi-layer structure including an $Al_2O_3$ film and an $SiO_2$ film.

RELATED ART DOCUMENTS

Patent Documents

Patent Document 1: Japanese Patent Application Laid-Open Publication No. 2008-103408

SUMMARY OF THE INVENTION

In the configuration of Patent Document 1, it is necessary to form an opening in the interlayer insulating layer that exposes the AlGaN layer by etching. As a result, damage to the surface of the AlGaN layer due to etching is unavoidable. Thus, the boundary between the AlGaN layer and the gate insulating layer is not necessarily in a good state, which presents a problem in that it is difficult to attain excellent device characteristics.

One object of the present invention is to provide a nitride semiconductor device having an excellent boundary between the nitride semiconductor and the gate insulating film, thus improving the device characteristics, and a manufacturing method therefor.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in a first aspect of the present invention, a nitride semiconductor device is provided, the nitride semiconductor device including: an electron transport layer made of a nitride semiconductor; an electron supply layer layered on the electron transport layer, the electron supply layer being made of a nitride semiconductor including Al and having an Al composition different from that of the electron transport layer; a source electrode and a drain electrode disposed on the electron supply layer with a gap therebetween; a gate insulating film covering a surface of the electron supply layer between the source electrode and the drain electrode; a passivation film covering a surface of the gate insulating film and having an opening between the source electrode and the drain electrode, the opening being at a distance from the source electrode and the drain electrode; and a gate electrode disposed in the opening in the passivation film and in contact with the gate insulating film, the gate electrode having a main gate body facing the electron supply layer through the gate insulating film.

According to this configuration, the electron transport layer and the electron supply layer made of nitride semiconductors having different Al compositions are in contact with each other, thus forming a heterojunction. As a result, a two dimensional electron gas is formed within the electron transport layer, near the boundary between the electron transport layer and the electron supply layer, thus forming an HEMT (high electron mobility transistor) using the two dimensional electron gas as a channel.

A source electrode and a drain electrode are formed with a gap therebetween on the electron supply layer, and the gate insulating film covers the surface of the electron supply layer therebetween. In addition, the gate insulating film is covered by the passivation film. The passivation film has an opening formed between the source electrode and the drain electrode, and the main gate body of the gate electrode is disposed in the opening. The main gate body faces the electron supply layer through the gate insulating film.

Thus, the two dimensional electron gas, which serves as a channel between the source and the drain, can be controlled by applying a control voltage to the gate electrode. As a result, the channel between the source and the drain can be turned on or off.

The gate insulating film is interposed between the passivation film and the electron supply layer, and thus, when forming an opening in the passivation film by etching, the etching is stopped by the gate insulating film. Thus, the surface of the electron supply layer does not receive damage from etching, and the surface of the electron supply layer is not exposed to air. Therefore, the boundary state between the gate insulating film and the electron supply layer is excellent, and thus, excellent device characteristics can be attained.

A second aspect of the present invention has the configuration above, wherein the gate insulating film is a multilayer gate insulating film including a first insulating layer in contact with the electron supply layer and having N, and a second insulating layer layered onto the first insulating layer and made of a metal oxide including Al, Y, Hf, Ta, Nb, or a trivalent lanthanoid metal.

According to this configuration, the first insulating layer in contact with the electron supply layer is made of an insulating layer using the same type of anion as the nitride semiconductor layer used in the electron supply layer, or in other words, an insulating layer including N. As a result, it is possible to mitigate nitrogen escaping from the electron supply layer, and the interface state can be reduced, thus mitigating current collapse. On the other hand, the nitride has bad composition stability, thus making it difficult to make a stable gate insulating film with the nitride alone. To deal with this, a second insulating layer made of a metal oxide including Al, Y, Hf, Ta, Nb, or a trivalent lanthanoid metal is layered onto the first insulating layer that includes N, thus forming a multilayer gate insulating film. As a result, a stable gate insulating film can be provided. An insulating film made of a metal oxide including Al, Y, Hf, Ta, Nb, or a trivalent lanthanoid metal can be formed by a method such as ALD (atomic layer deposition) in which the film thickness can be precisely controlled. As a result, the thickness of the gate insulating film can be precisely controlled, and thus, stable device characteristics can be attained. In addition, Al, Y, Hf, Ta, Nb, or a trivalent lanthanoid metal has a high affinity with oxygen, and thus, the effect of oxygen on the boundary with the first insulating layer can be made small.

Examples of an insulating material containing N include SiN, AlN, GaN, and InN, and these can be used as a material for the first insulating layer. Examples of an insulating material made of a metal oxide including Al, Y, Hf, Ta, Nb, or a trivalent lanthanoid metal include an Al oxide, a Y oxide, an Hf oxide, a Ta oxide, an Nb oxide, and an La oxide, and these can be used as the material for the second insulating layer.

A third aspect of the present invention has the configuration above, wherein the first insulating layer is an insulating layer made of Si and N. According to this configuration, where appropriate, the interface state at the boundary thereof with the electron supply layer made of a nitride semiconductor can be reduced, thus mitigating or preventing current collapse.

A fourth aspect of the present invention is the second or third aspect, wherein the second insulating layer is an insulating layer made of Al and O. According to this configuration, the second insulating layer can be made at a precise thickness by ALD. Even if the passivation film is made of a nitride, when forming an opening in the passivation film, the etching of the passivation film can be reliably stopped at the second insulating layer. In other words, the second insulating layer can be used as an etching stopping layer. As a result, etching damage on the surface of the electron supply layer can be more reliably prevented. The insulating layer made of Al and O does not necessarily need to be $Al_2O_3$ in its entirety, and may have portions with a different composition ratio of Al and O. When forming an alumina film by ALD, in general, variation occurs in the composition ratio of Al and O. An insulating body made of Al and O can be formed into an insulating layer with a high withstand voltage and a high bandgap even if the composition thereof is not precisely controlled.

A fifth aspect of the present invention is any one of the first to fourth aspects, wherein a thickness of the gate insulating film is between 1 nm and 20 nm inclusive. In some cases, it is difficult to control the thickness of the gate insulating film at 1 nm or less, and thus, there is a possibility that having stable device characteristics is difficult. If the thickness of the gate insulating film exceeds 20 nm, then in some cases, the absolute value of the threshold voltage (negative value) for blocking the channel between the source and the drain by making the two dimensional electron gas disappear directly below the gate electrode becomes too large, and thus, there is a possibility that the design of the driver circuit would be difficult.

A sixth aspect of the present invention is any one of the first to fifth aspects, wherein the electron supply layer includes a cap layer made of a nitride semiconductor with the same composition as the electron transport layer, with the source electrode, the drain electrode, and the gate insulating film disposed so as to be in contact with the cap layer. According to this configuration, the cap layer formed on the electron supply layer is made of a nitride semiconductor having the same composition as the electron transport layer, and thus, the morphology of the surface of the electron supply layer can be improved. As a result, a nitride semiconductor device with an HEMT structure with more stable characteristics can be provided.

A seventh aspect of the present invention is the sixth aspect, wherein a thickness of the cap layer is 16 nm or less (more preferably 8 nm or less). If the thickness of the cap layer exceeds 16 nm, then in some cases, the effect of improving the surface morphology is made small, and the ohmic contact of the source electrode and the drain electrode is inhibited. It is preferable that the thickness of the cap layer be at least 2 nm in order to further improve surface morphology.

An eighth aspect of the present invention is any one of the first to seventh aspects, wherein the gate electrode further includes a field plate that is continuous to the main gate body and that extends towards the drain electrode on a surface of the passivation film outside of the opening, the field plate having a prescribed field plate length. According to this configuration, the gate electrode has a field plate extending from the main gate body on the passivation film. As a result, it is possible to mitigate the concentration of the electric field in the drain electrode side edge of the main gate body. Furthermore, the gate insulating film is interposed between the main gate body and the surface of the electron supply layer, while not only the gate insulating film but also the passivation film is interposed between the field plate and the surface of the electron supply layer. Thus, it is possible to dispose the main gate body sufficiently close to the electron supply layer and to dispose the field plate sufficiently far from the electron supply layer. In other words, the distance between the main gate body and the electron supply layer can be set independent of the distance between the field plate and the electron supply layer. As a result, the threshold voltage for blocking the channel between the source and the drain, and the withstand voltage between the gate electrode and the drain electrode can be set to appropriate levels with relative ease, thus balancing the characteristics thereof with relative ease.

A ninth aspect of the present invention is the eighth aspect, wherein the field plate length is between ⅙ and ½ inclusive of a distance between the main gate body and the drain electrode. With this configuration, the concentration of the electric field in the drain electrode side edge of the main gate body can be more effectively mitigated, and short-circuiting due to the electric field between the edge of the field plate and the drain electrode (breakage of the passivation film) can be effectively prevented.

A tenth aspect of the present invention is any one of the first to ninth aspects, wherein the electron supply layer includes an AlGaN layer having an Al composition of between 13% and 30% inclusive, and having a thickness of between 5 nm and 30 nm inclusive. If the Al composition of the electron supply layer is less than 13%, then in some cases, the carrier concentration of the two dimensional electron gas becomes low, resulting in the possibility of worsening characteristics. Also, if the Al composition of the electron supply layer exceeds 30%, then in some cases, the absolute value of the threshold voltage (negative value) becomes too large, and there is a possibility of the leak current increasing. If the thickness of the electron supply layer is less than 5 nm, then in some cases, the carrier concentration of the two dimensional electron gas becomes low, resulting in the possibility of worsening characteristics. If the thickness of the electron supply layer exceeds 30 nm, then in some cases, there is a possibility that the ohmic contact between the source electrode and the drain electrode, and the two dimensional electron gas becomes difficult, and there is a possibility that the absolute value of the threshold voltage (negative value) becomes too large.

In an eleventh aspect of the present invention, a manufacturing method for a nitride semiconductor device includes: forming an electron transport layer made of a nitride semiconductor; forming an electron supply layer on the electron transport layer, the electron supply layer being made of a nitride semiconductor including Al and having an Al composition different from that of the electron transport layer; forming a gate insulating film on the electron supply layer; forming a source electrode and a drain electrode with a gap therebetween, in contact with the electron supply layer; forming a passivation film on the gate insulating film; forming an opening in the passivation film between the source electrode and the drain electrode, at a distance from the source electrode and the drain electrode; and forming a gate electrode in the opening in the passivation film so as to be in contact with the gate insulating film, the gate electrode having a main gate body facing the electron supply layer through the gate insulating film. With this method, the nitride semiconductor device of the first aspect of the present invention can be manufactured.

A twelfth aspect of the present invention is the method of the eleventh aspect, wherein the step of forming an opening in the passivation film includes etching, using the gate insulating film as an etching stopper. With this method, when an opening is formed in the passivation film, the surface of the electron supply layer directly below the gate electrode is not exposed, and thus, etching damage on the surface of the electron supply layer can be prevented, and the exposure of the electron supply layer to air can also be avoided. As a result, a nitride semiconductor device with excellent characteristics can be manufactured.

A thirteenth aspect of the present invention is the method of the eleventh aspect or the twelfth aspect, wherein the step of forming a gate insulating film includes forming a first insulating layer in contact with the electron supply layer and having N, and forming a second insulating layer layered on the first insulating layer and made of a metal oxide including Al, Y, Hf, Ta, Nb, or a trivalent lanthanoid metal. With this method, the nitride semiconductor device of the second aspect can be manufactured.

A fourteenth aspect of the present invention is the thirteenth aspect, wherein the first insulating layer is an insulating layer made of Si and N. With this method, the nitride semiconductor device of the third aspect can be manufactured.

A fifteenth aspect of the present invention is the thirteenth aspect or the fourteenth aspect, wherein the second insulating layer is an insulating layer made of Al and O. With this method, the nitride semiconductor device of the fourth aspect can be manufactured.

A sixteenth aspect of the present invention is the method of any one of the eleventh to fifteenth aspects, wherein the step of forming an electron supply layer includes forming a cap layer made of a nitride semiconductor with the same composition as the electron transport layer, with the source electrode, the drain electrode, and the gate insulating film formed so as to be in contact with the cap layer. With this method, the nitride semiconductor device of the sixth aspect can be manufactured.

A seventeenth aspect of the present invention is any one of the eleventh to sixteenth aspects, wherein the gate electrode is formed so as to include a field plate that is continuous to the main gate body and that extends towards the drain electrode on a surface of the passivation film outside of the opening, the field plate having a prescribed field plate length. With this method, the nitride semiconductor device of the eighth aspect can be manufactured.

DETAILED DESCRIPTION OF THE PREFERRED EMBODIMENTS

Below, embodiments of the present invention will be explained in detail with reference to appended drawings.

Figure 1:
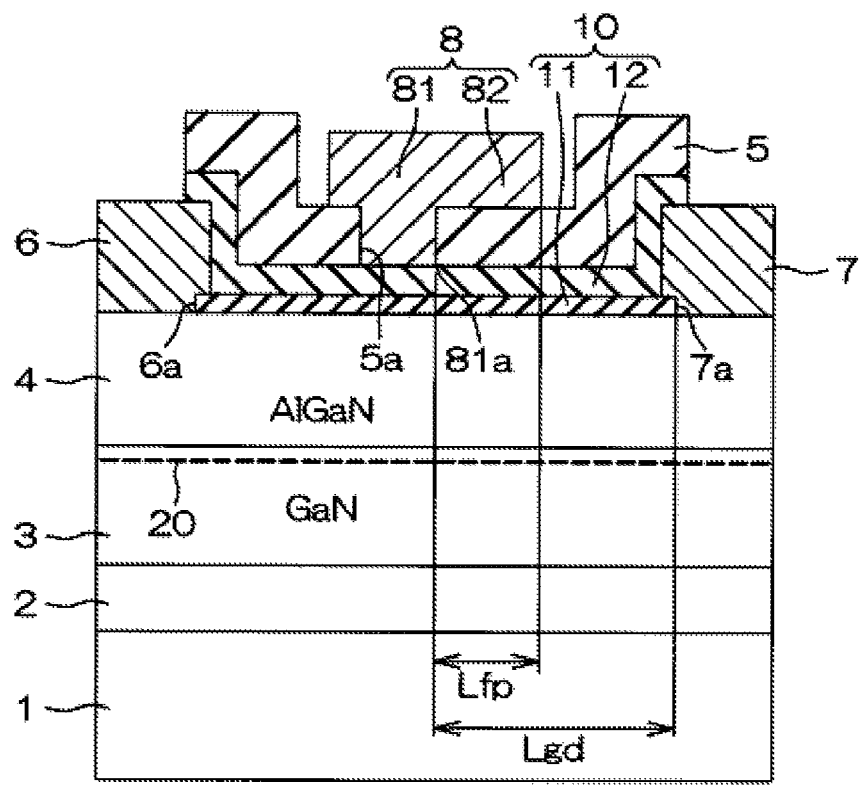
FIG. 1 is a cross-sectional view for describing a configuration of a nitride semiconductor device according to Embodiment 1 of the present invention.
Figure 2:
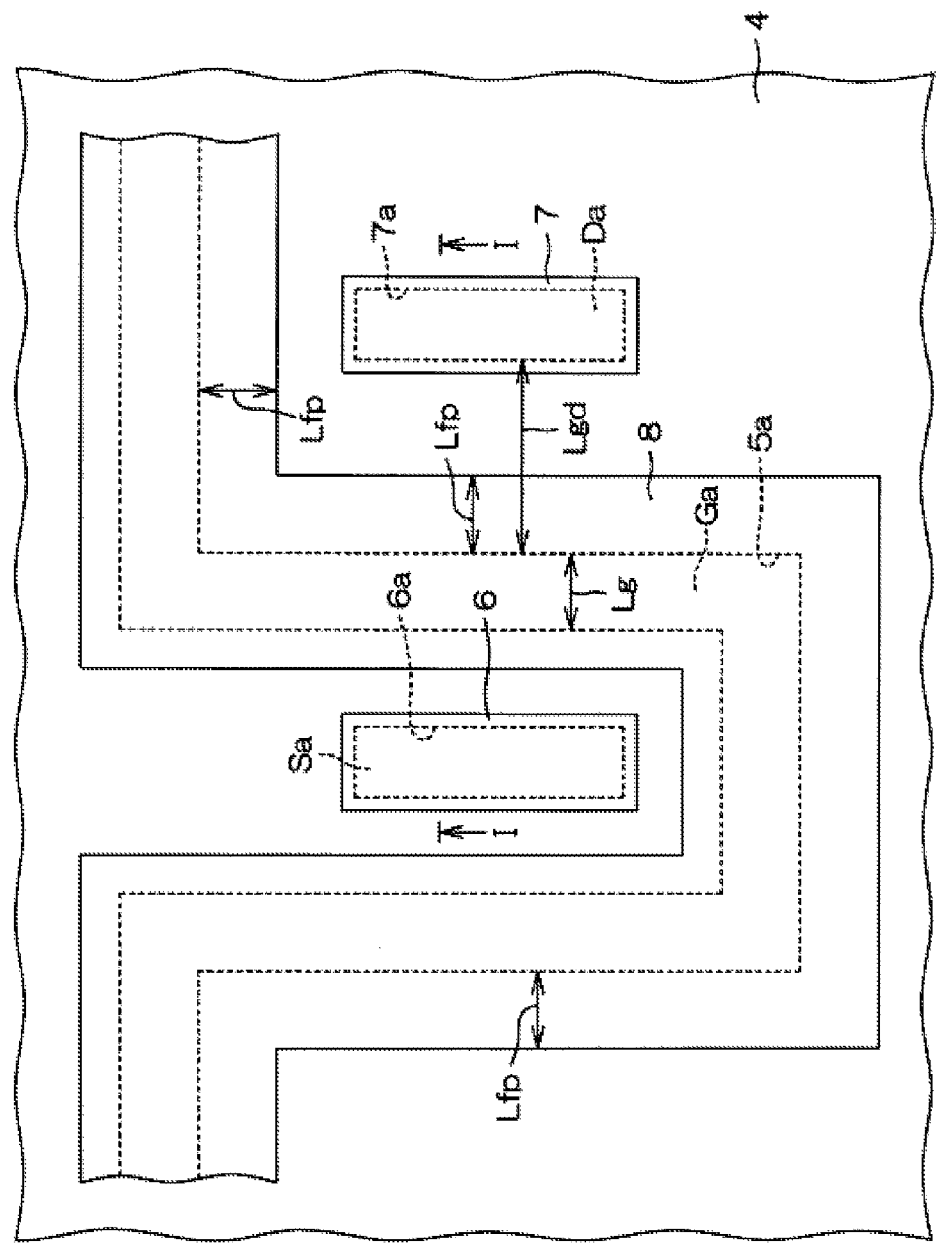
FIG. 2 is a plan view of the nitride semiconductor device of Embodiment 1.

FIG. 1 is a cross-sectional view for describing a configuration of a nitride semiconductor device according to Embodiment 1 of the present invention. FIG. 2 is a plan view of the nitride semiconductor device. FIG. 1 shows a cross-section of FIG. 2 along the line I-I. The nitride semiconductor device includes a substrate 1 (a silicon substrate, for example), a buffer layer 2 formed on a surface of the substrate 1, an electron transport layer 3 formed on the buffer layer 2 by epitaxial growth, and an electron supply layer 4 formed on the electron transport layer 3 by epitaxial growth. The nitride semiconductor device further includes a gate insulating film 10 (not shown in FIG. 2) covering the surface of the electron supply layer 4, a passivation film 5 (not shown in FIG. 2) covering the gate insulating film 10, and a source electrode 6 and a drain electrode 7, which are ohmic electrodes in ohmic contact with the electron supply layer 4 through contact holes 6a and 7a formed in the gate insulating film 10. The source electrode 6 and the drain electrode 7 are formed with a gap therebetween, and a gate electrode 8 is formed therebetween. The gate electrode 8 faces the electron supply layer 4 through the gate insulating film 10.

The gate insulating film 10 is a multilayer gate insulating film in which a first insulating layer 11 and a second insulating layer 12 are layered one on top of the other. The first insulating layer 11 is in contact with a surface of the electron supply layer 4, and the second insulating layer 12 is layered on a surface of the first insulating layer 11 (surface thereof opposite to the electron supply layer 4). The first insulating layer 11 is made of an SiN film in the present embodiment, and the thickness thereof may be approximately 30 Å, for example. Such a first insulating layer 11 can be formed by plasma CVD (chemical vapor deposition), heat CVD, sputtering, or the like. The second insulating layer 12 is made of alumina ($Al_aO_b$) in the present embodiment, and the thickness thereof may be approximately 50 Å, for example. Such a second insulating layer 12 can be formed by precisely controlling the thickness thereof by ALD or the like, for example.

When forming an alumina film by ALD, variation occurs in the composition ratio a:b between Al and O, which means that in general, $Al_2O_3$ is not necessarily formed throughout the entire alumina film. This is because ALD is a relatively low temperature process. However, an insulating body made of Al and O can be formed into an insulating layer with a high bandgap and a high withstand voltage even if the composition thereof is not strictly controlled. In the present specification, a ratio a:b between Al and O that is not 2:3 is also included under the definition of "alumina."

The passivation film 5 may be an SiN film approximately 750 Å in thickness, for example. In other words, the passivation film 5 may be made of a nitride similar to the first insulating layer 11. The passivation film 5 has an opening 5a formed therein such that the gate electrode 8 is formed into the opening 5a, to be in contact with the gate insulating film 10. The etching process to form the opening 5a in the passivation film 5 stops at the second insulating layer 12, and thus, the first insulating layer 11 is not damaged. Therefore, the opening 5a can be formed without causing etching damage to the surface of the electron supply layer 4, and without exposing the surface of the electron supply layer 4 to air.

The electron transport layer 3 and the electron supply layer 4 are made of group III nitride semiconductors (hereinafter referred to simply as "nitride semiconductors") of different Al compositions. The electron transport layer 3 may be made of a GaN layer and the thickness thereof may be approximately 0.5 μm, for example. In the present embodiment, the electron supply layer 4 is made of an $Al_xGa_{1-x}N$ layer (0<X<1), and the thickness thereof is 5 to 30 nm (approximately 20 nm, for example), for example. It is preferable that the electron supply layer 4 be made of an AlGaN layer having an Al composition of between 13% and 30% inclusive.

Thus, the electron transport layer 3 and the electron supply layer 4 are made of nitride semiconductors of different Al compositions and form a heterojunction with a lattice mismatch occurring therebetween. Due to polarization caused by the heterojunction and the lattice mismatch, a two dimensional electron gas 20 is spread throughout portions close to the boundary between the electron transport layer 3 and the electron supply layer 4 (portions a few Å from the boundary, for example).

The boundary between the electron supply layer 4 and the electron transport layer 3 may have an AlN layer that is a few atoms thick (less than or equal to 5 nm, preferably 1 to 5 nm, and more preferably 1 to 3 nm). Such an AlN layer mitigates the scattering of electrons, which contributes to improved electron mobility.

The gate electrode 8 may be a layered electrode film having a lower layer in contact with the gate insulating film 10, and an upper layer layered on top of the lower layer. The lower layer may be made of Ni or Pt, and the upper layer may be made of Au or Al. The gate electrode 8 is disposed closer to the source electrode 6, and this results in an asymmetric configuration in which the distance between the gate and the drain is longer than the distance between the gate and the source. This asymmetric configuration weakens the strong electric field occurring between the gate and drain, contributing to an increased withstand voltage.

The gate electrode 8 has a main gate body 81 disposed in the opening 5a formed in the passivation film 5 between the source electrode 6 and the drain electrode 7, and a field plate 82 that is continuous to the main gate body 81 and extends towards the drain electrode 7 over the passivation film 5 outside of the opening 5a. The gate insulating film 10 is exposed in the opening 5a, and the main gate body 81 is in contact with the gate insulating film 10 at the bottom of the opening 5a. A distance Lfp (approximately 2.25 μm, for example) from a drain edge 81a, which is an edge of the main gate body 81 on the drain electrode 7 side at the boundary between the main gate body 81 and the gate insulating film 10, to an edge of the field plate 82 on the drain electrode 7 side is referred to as the field plate length. It is preferable that the field plate length Lfp be between ⅙ and ½ inclusive of a distance Lgd (approximately 9 μm, for example) from the drain edge 81a to the drain electrode 7. As a result, it is possible to mitigate the concentration of an electric field at the drain edge 81a, and the breakage of the passivation film 5 due to an electric field between the drain side edge of the field plate 82 and the drain electrode 7 can be more reliably prevented.

The source electrode 6 and the drain electrode 7 are ohmic electrodes that include Ti and Al, for example, and are in ohmic contact with the two dimensional electron gas 20 formed on the electron transport layer 3.

The buffer film 2 may be made of an AlGaN layer, for example, or may have a superlattice structure in which an AlN layer and a GaN layer are repeatedly layered one on top of the other.

In the nitride semiconductor device, a heterojunction is formed by the electron supply layer 4 being formed on the electron transport layer 3, the electron supply layer 4 having a different Al composition therefrom. As a result, the two dimensional electron gas 20 is formed in the electron transport layer 3 near the boundary between the electron transport layer 3 and the electron supply layer 4, and an HEMT is formed, using this two dimensional electron gas 20 as a channel. The gate electrode 8 faces the electron supply layer 4 through the gate insulating film 10. If an appropriate negative voltage is applied to the gate electrode 8, the channel formed by the two dimensional electron gas 20 can be blocked. Thus, by applying a control voltage to the gate electrode 8, the channel between the source and drain can be turned on and off.

As for usage, a prescribed voltage (200V to 600V, for example) in which the drain electrode 7 side takes on a positive charge is applied between the source electrode 6 and the drain electrode 7, for example. In this state, an off voltage (−5V, for example) or an on voltage (0V, for example) is applied to the gate electrode 8, with the source electrode 6 being at a reference potential (0V).

As shown in FIG. 2, in a plan view, the gate electrode 8 is drawn such that a junction region (source junction region; region inside the contact hole 6a) Sa between the source electrode 6 and the electron supply layer 4 is separated from a junction region (drain junction region; region inside the contact hole 7a) Da between the drain electrode 7 and the electron supply layer 4. In other words, a contact region (active gate region; region inside the opening 5a) Ga between the main gate body 81 of the gate electrode 8 and the gate insulating film 10 is formed in a belt-shaped pattern of a certain width that separates the source junction region Sa and the drain junction region Da. More specifically, the source junction region Sa and the drain junction region Da are rectangular regions having the respective longer side directions thereof parallel to each other, and being aligned along the shorter side directions of the rectangular regions thereof. The active gate region Ga is formed in a zigzag shape passing between the source junction region Sa and the drain junction region Da. The active gate region Ga is disposed so as to be closer to the source junction region Sa than the drain junction region Da. The distance between the active gate region Ga and the edge of the drain junction region Da side of the gate electrode 8 is the field plate length Lfp. The width of the active gate region Ga is a gate length Lg (approximately 1 μm, for example).

FIGS. 3A to 3G are cross-sectional views for describing one example of a manufacturing process of the nitride semiconductor device described above, and the cross-sectional configurations at a plurality of steps in the manufacturing process are shown.

Figure 3A:
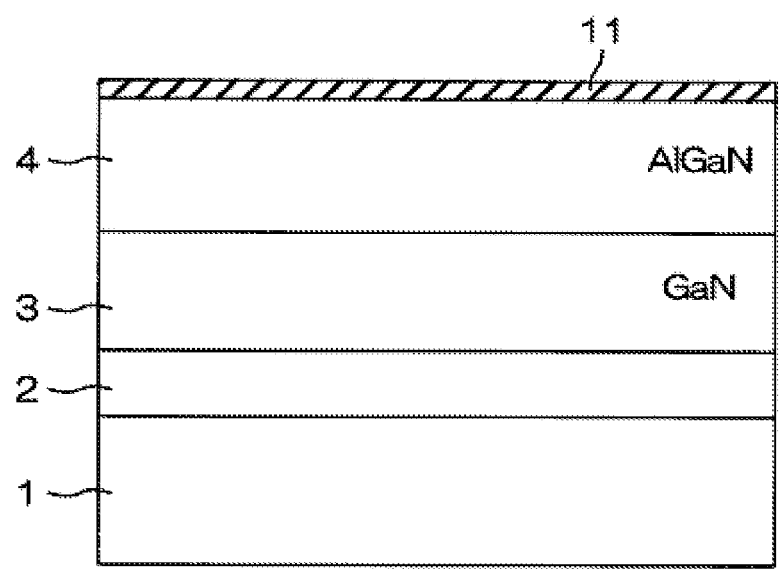
FIG. 3A is a cross-sectional view of a configuration of the nitride semiconductor device of FIG. 1 during a step of the manufacturing process therefor.

First, as shown in FIG. 3A, on the substrate 1, the buffer layer 2 and the electron transport layer 3 are layered by epitaxial growth in that order, and the electron supply layer 4 is layered on the electron transport layer 3 by epitaxial growth. Then, the first insulating layer 11 of the gate insulating film 10 is formed so as to cover the entire surface of the electron supply layer 4. More specifically, the first insulating layer 11 made of SiN is formed so as to cover the surface of the electron supply layer 4. Thereafter, the surface of the electron supply layer 4 is not exposed to air. The first insulating layer 11 is formed by plasma CVD, heat CVD, or sputtering, for example.

Figure 3B:
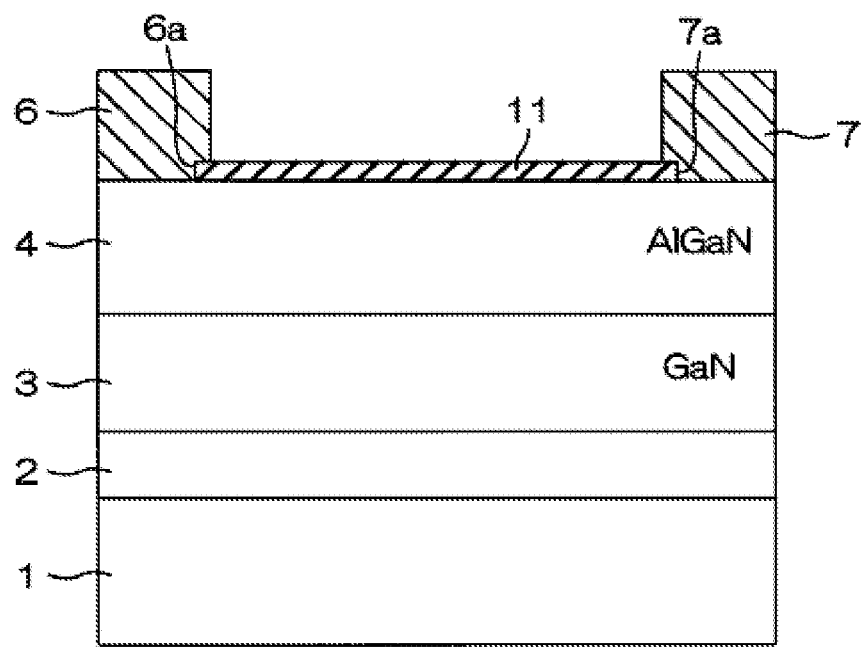
FIG. 3B is a cross-sectional view of a configuration in a step after that of FIG. 3A.

Next, as shown in FIG. 3B, the contact hole 6a for the source electrode and the contact hole 7a for the drain electrode are formed in the first insulating layer 11 at a distance from each other. Then, the source electrode 6 and the drain electrode 7 are formed so as to fill the contact holes 6a and 7a and so as to be in contact with the surface of the electron supply layer 4. The electrodes 6 and 7 are ohmic electrodes, and are formed by forming a Ti layer in contact with the surface of the electron supply layer 4, forming an Al layer thereon, and sintering (a heat treatment conducted for 10 minutes at 550° C. in a nitrogen atmosphere, for example) the resultant layered metal layer, for example. The Ti layer and the Al layer can be formed by sputtering, for example.

Figure 3C:
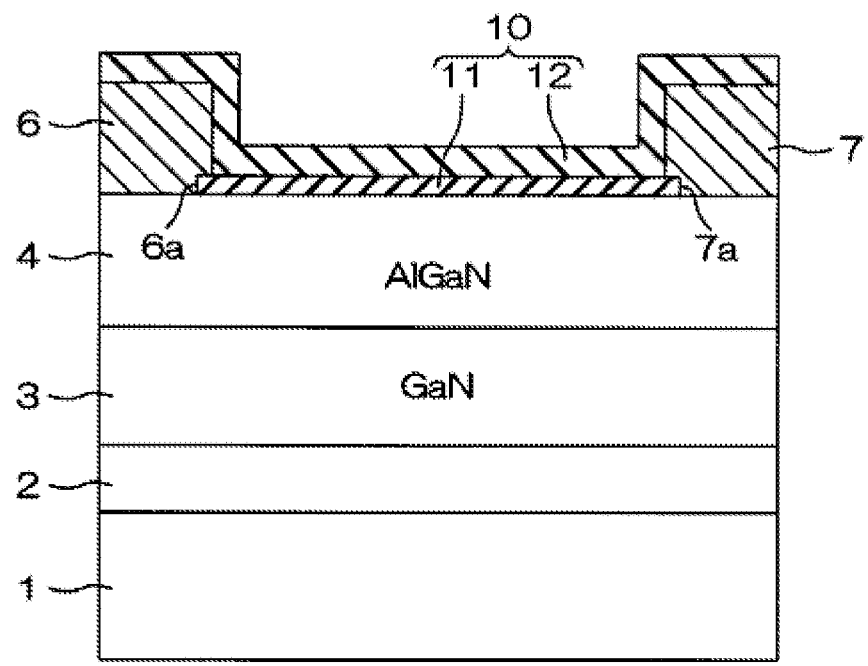
FIG. 3C is a cross-sectional view of a configuration in a step after that of FIG. 3B.

Next, as shown in FIG. 3C, the second insulating layer 12 made of alumina is formed on the entire surface. In other words, the second insulating layer 12 covers the surface of the first insulating layer 11, and also covers the exposed surfaces of the source electrode 6 and the drain electrode 7. The second insulating layer 12 can be formed by ALD, for example, in which precise film thickness control can be conducted.

Figure 3D:
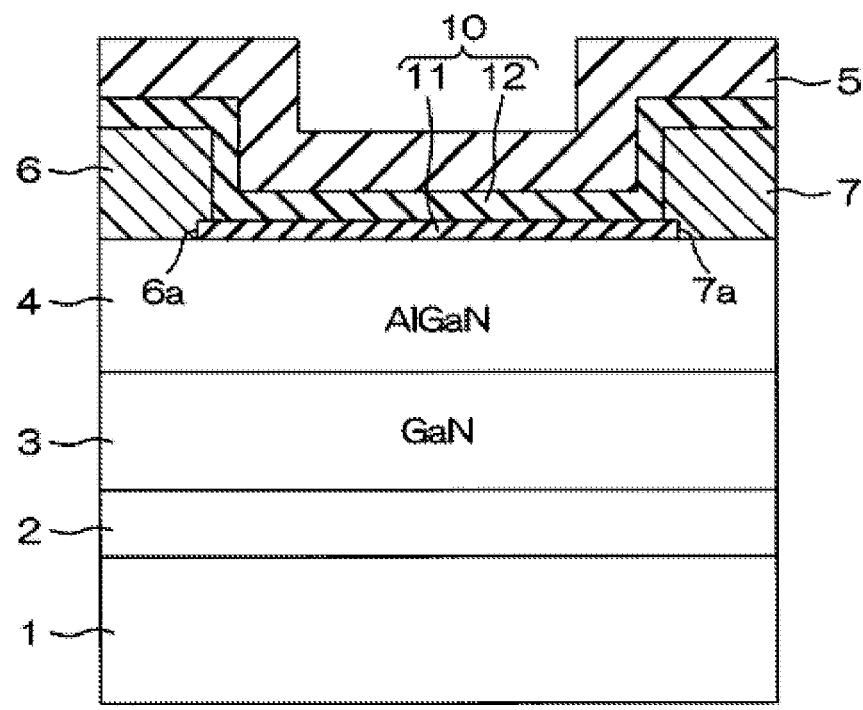
FIG. 3D is a cross-sectional view of a configuration in a step after that of FIG. 3C.

Next, as shown in FIG. 3D, the passivation film 5 made of SiN is formed covering the entire surface of the second insulating layer 12. The passivation film 5 can be formed by plasma CVD, for example.

Figure 3E:
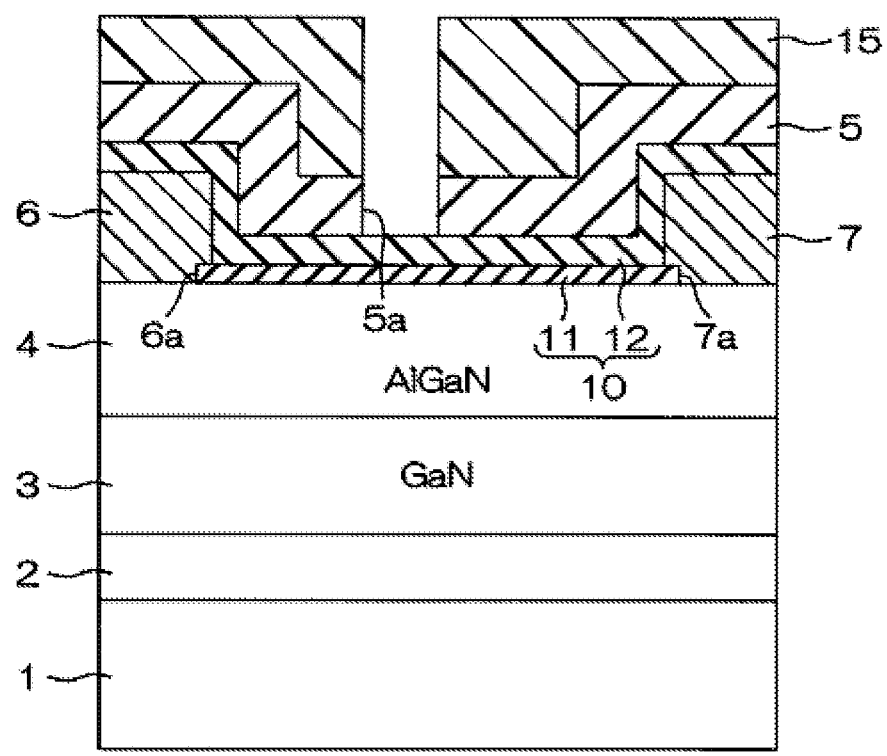
FIG. 3E is a cross-sectional view of a configuration in a step after that of FIG. 3D.

Next, as shown in FIG. 3E, the opening 5a is formed penetrating the passivation film 5 in a position between the source electrode 6 and the drain electrode 7, at a distance therefrom. The opening 5a can be formed by dry etching using a resist film 15 as a mask, for example. This dry etching is conducted until the second insulating layer 12 is exposed at the bottom of the opening 5a. In other words, etching is conducted in order to form the opening 5a, using the second insulating layer 12 made of alumina as an etching stopper. Then, the resist film 15 is removed.

Figure 3F:
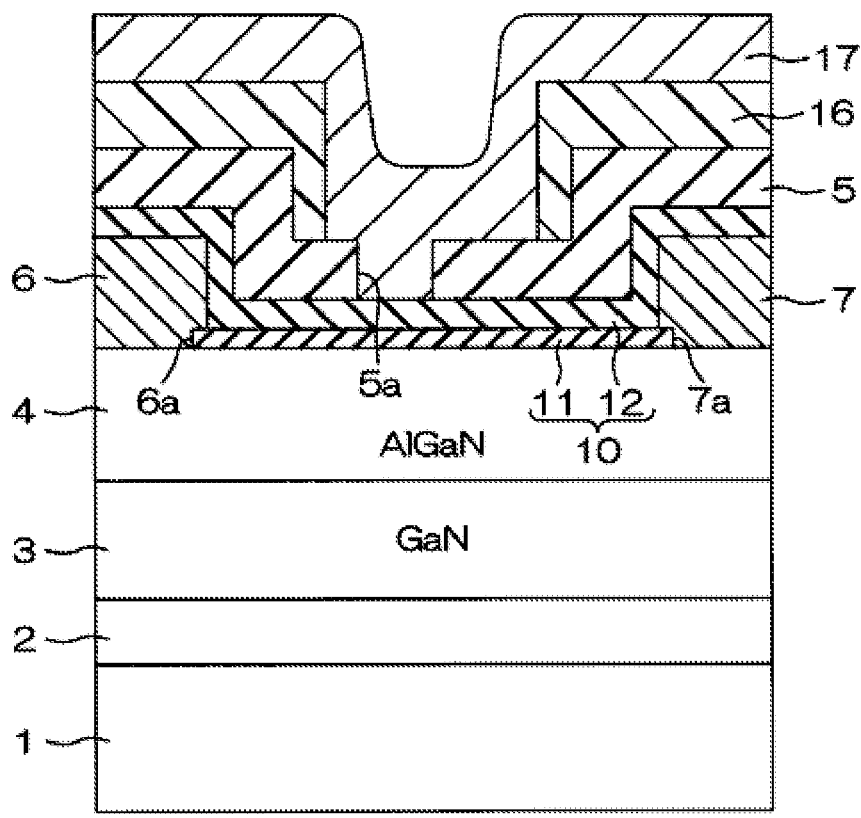
FIG. 3F is a cross-sectional view of a configuration in a step after that of FIG. 3E.

Next, as shown in FIG. 3F, a resist film 16 having an opening where the gate electrode 8 will be disposed is formed, and an electrode film 17 is formed covering the entire surface of the resist film 16 in this state. The electrode film 17 is formed inside the opening 5a of the passivation film 5 and faces the electron supply layer 4 through the gate insulating film 10 at the bottom of the opening 5a. The opening of the resist film 16 includes the region of the opening 5a formed in the passivation film 5, and is larger in area than the opening 5a. The edge of the opening of the resist film 16 on the side of the drain electrode 7 is positioned closer to the drain electrode 7 than the drain side edge of the opening 5a of the passivation film 5 by a field plate distance Lfp. The electrode film 17 is a layered metal film including a lower layer made of Ni or Pt and an upper layer made of Au or Al, for example, and each layer is vapor-deposited in that order.

Figure 3G:
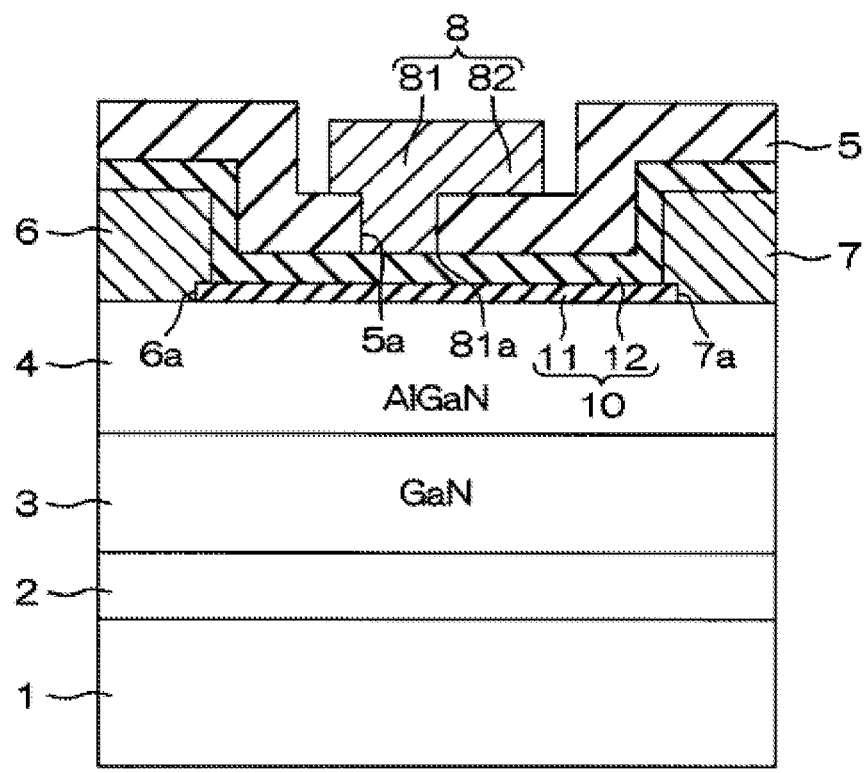
FIG. 3G is a cross-sectional view of a configuration in a step after that of FIG. 3F.

Next, as shown in FIG. 3G, the electrode film 17 on the resist film 16 (unneeded portion of the electrode film 17) is lifted off along with the resist film 16, and thus, the electrode film 17 is patterned, forming the gate electrode 8. Then, selective etching is conducted on the passivation film 5 and the second insulating layer 12, exposing the source electrode 6 and the drain electrode 7. Thus, the nitride semiconductor device of the configuration shown in FIG. 1 is obtained. Then, the entire surface is covered by an interlayer insulating film, and contact holes exposing the source electrode 6 and the drain electrode 7 are formed in the interlayer insulating film. Source wiring lines and drain wiring lines respectively connected to the source electrodes 6 and the drain electrodes 7 through the contact holes are formed on the interlayer insulating film.

As stated above, according to the present embodiment, the source electrode 6 and the drain electrode 7 are formed at a distance from each other on the electron supply layer 4, and the surface of the electron supply layer 4 therebetween is covered by the gate insulating film 10. In addition, the gate insulating film 10 is covered by the passivation film 5. The opening 5a is formed in the passivation film 5 between the source electrode 6 and the drain electrode 7, and the main gate body 81 of the gate electrode 8 is formed in the opening 5a. The main gate body 81 faces the electron supply layer 4 through the gate insulating film 10. Thus, the two dimensional electron gas 20, which serves as a channel between the source and the drain, can be controlled by applying a control voltage to the gate electrode 8. As a result, the channel between the source and the drain can be turned on or off.

The gate insulating film 10 is interposed between the passivation film 5 and the electron supply layer 4, and thus, when forming an opening in the passivation film 5 by etching, the gate insulating film 10 stops the etching. Thus, the surface of the electron supply layer 4 does not receive damage from etching, and the surface of the electron supply layer 4 is not exposed to air. Therefore, the state of the boundary between the gate insulating film 10 and the electron supply layer 4 is excellent, and as a result, excellent device characteristics can be attained.

Also, in the present embodiment, the gate insulating film 10 is a multilayer gate insulating film in which the first insulating layer 11 and the second insulating layer 12 are layered together, and the first insulating layer 11 in contact with the electron supply layer 4 is made of an insulating material having an anion that is of the same type as AlGaN, which is the nitride semiconductor used in the electron supply layer 4; in other words, the first insulating layer 11 is made of SiN, which is an insulating material including N. As a result, it is possible to more reliably mitigate nitrogen escaping from the electron supply layer 4, and the interface state can be reduced, thus reliably mitigating current collapse. On the other hand, in some cases, SiN has a bad composition stability, and it is thus difficult to form a stable gate insulating film with only SiN. In the present embodiment, the gate insulating film 10 is made by layering the second insulating layer 12 made of alumina on the first insulating layer 11 made of SiN. As a result, a nitride semiconductor device having the gate insulating film 10 with more stable characteristics can be provided. An insulating layer made of a metal oxide (alumina in the present embodiment) including Al, Y, Hf, Ta, Nb, or a trivalent lanthanoid metal can be formed by a method such as ALD in which the film thickness can be precisely controlled. Thus, by including the second insulating layer 12, the thickness of the gate insulating layer 10 can be precisely controlled, thereby attaining more stable device characteristics. In addition, Al, Y, Hf, Ta, Nb, or a trivalent lanthanoid metal has a high affinity with oxygen, and thus, the effect of oxygen on the boundary with the first insulating layer 11 can be made small.

Also, in the present embodiment, the first insulating layer 11 is made of SiN, which is the same material used in the passivation film 5, while the second insulating layer 12 is made of alumina, which is a different material from the passivation film 5. As a result, when forming the second insulating layer 12 at a more precise thickness, and when forming the opening 5a in the passivation film 5, the etching of the passivation film 5 can be reliably stopped at the second insulating layer 12. In other words, the second insulating layer can be used as an etching stopping layer. As a result, etching damage on the surface of the electron supply layer 4 can be more reliably prevented.

It is preferable that the thickness of the entire gate insulating film 10 be between 1 nm and 20 nm inclusive. In some cases, it is difficult to control the thickness of the gate insulating film 10 at a thickness of 1 nm or less, thus making it difficult to have stable device characteristics. If the thickness of the gate insulating film 10 exceeds 20 nm, in some cases, the absolute value of the threshold voltage (negative value) for blocking the channel between the source and drain by making the two dimensional electron gas 20 disappear directly below the gate electrode becomes too large, which makes the design of the driver circuit difficult.

In the nitride semiconductor device of the present embodiment, the gate electrode 8 has the field plate 82 extending from the main gate body 81 on the passivation film 5. As a result, it is possible to mitigate the concentration of the electric field in the drain electrode side edge of the main gate body 81. Furthermore, while the gate insulating film 10 is interposed between the main gate body 81 and the surface of the electron supply layer 4, not only the gate insulating film 10 but the passivation film 5 is also interposed between the field plate 82 and the surface of the electron supply layer 4. Thus, the main gate body 81 can be made sufficiently close to the electron supply layer 4 and the field plate 82 can be made sufficiently far from the electron supply layer 4. In other words, the distance between the main gate body 81 and the electron supply layer 4, and the distance between the field plate 82 and the electron supply layer 4 can be set independent of each other. As a result, the threshold voltage for blocking the channel between the source and the drain, and the withstand voltage between the gate electrode 8 and the drain electrode 7 can be set to appropriate levels with relative ease, thus balancing the characteristics thereof with relative ease.

In the present embodiment, the field plate length Lfp is between ⅙ and ½ inclusive of the distance Lgd between the main gate body 81 and the drain electrode 7. As a result, the concentration of the electric field at the drain electrode 7 side edge of the main gate body 81 can be more reliably mitigated, and short-circuiting caused by the electric field between the edge of the field plate 82 and the drain electrode 7 (breakage of the passivation film 5) can be more reliably prevented.

As stated above, the electron supply layer 4 has a thickness of 5 to 30 nm (more specifically, approximately 20 nm), for example. It is preferable that the electron supply layer 4 be made of an AlGaN layer having an Al composition of between 13% and 30% inclusive. If the Al composition of the electron supply layer 4 is less than 13%, then in some cases, the carrier concentration of the two dimensional electron gas 20 becomes low, thus resulting in the possibility of worsened characteristics. Also, if the Al composition of the electron supply layer 4 exceeds 30%, then in some cases, the absolute value of the threshold voltage (negative value) becomes too large, and there is a possibility of the leak current increasing. On the other hand, if the thickness of the electron supply layer 4 is less than 5 nm, then in some cases, the carrier concentration of the two dimensional electron gas 20 becomes low, resulting in the possibility of worsening characteristics. If the thickness of the electron supply layer 4 exceeds 30 nm, then in some cases, there is a possibility that the ohmic contact between the source electrode 6 and the drain electrode 7, and the two dimensional electron gas 20 becomes difficult, and there is a possibility that the absolute value of the threshold voltage (negative value) becomes too large.

Figure 4:
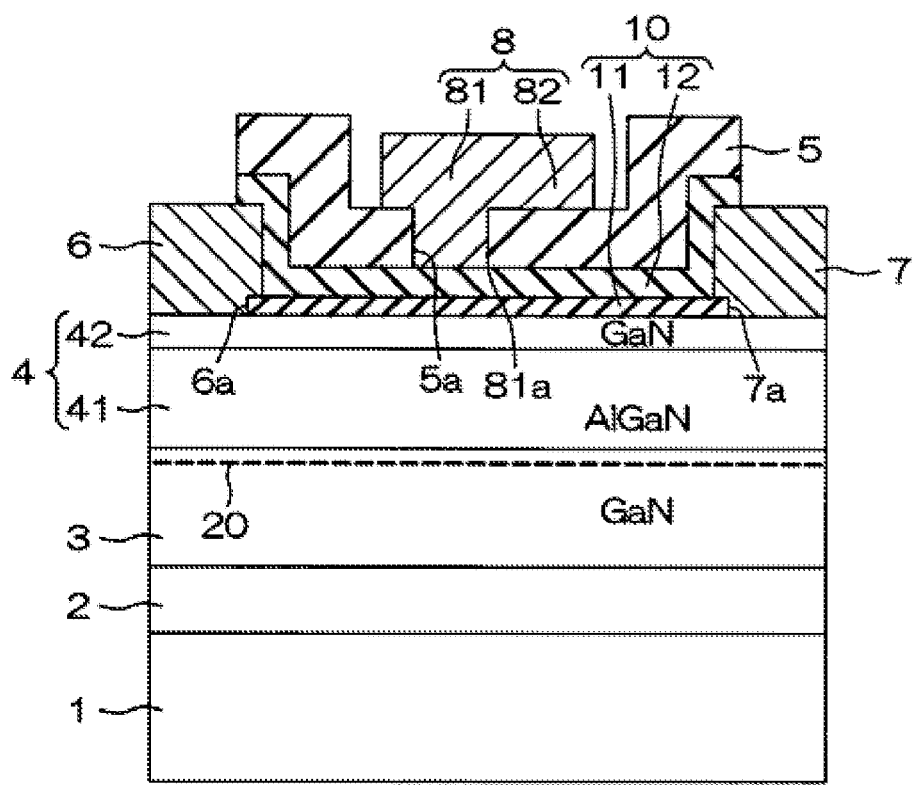
FIG. 4 is a schematic cross-sectional view for describing a configuration of a nitride semiconductor device according to Embodiment 2 of the present invention.

FIG. 4 is a schematic cross-sectional view for describing a configuration of a nitride semiconductor device according to Embodiment 2 of the present invention. In FIG. 4, portions corresponding to the portions in FIG. 1 are assigned the same reference characters.

In the present embodiment, an electron supply layer 4 includes a second layer 42 as a cap layer formed on a first layer 41 that is made of AlGaN. A source electrode 6 and a drain electrode 7, which are ohmic electrodes, and a gate insulating film 10 are formed on the second layer 42, in contact therewith.

The second layer 42 is made of GaN, which is a nitride semiconductor of the same composition as an electron transport layer 3, and the thickness thereof is between 2 nm and 16 nm inclusive (more preferably 8 nm or less).

The second layer 42 functioning as a cap layer contributes to an improved surface morphology of the electron supply layer 4. In other words, on the surface of the electron transport layer 3 made of GaN, the first layer 41 made of AlGaN having a different lattice constant therefrom is formed, and because AlGaN is a ternary crystal, the crystalline structure is not necessarily good. Thus, if the first layer 41 is the topmost surface of the electron supply layer 4, the surface morphology is not necessarily good, and there are cases in which the device characteristics are not stable as a result. By layering the second layer 42, which is a cap layer of the same composition as the electron transport layer 3, on the first layer 41, the surface morphology of the electron supply layer 4 can be improved, thus further improving the device characteristics. However, if the second layer 42 is too thick, in some cases, the improvement of the surface morphology becomes small, and the ohmic contact with the source electrode 6 and the drain electrode 7 becomes worse, and therefore, it is preferable that the thickness of the second layer 42 be 16 nm or less (more preferably 8 nm or less).

The embodiments of the present invention have been described, but other embodiments are possible for the present invention. For example, in the embodiments above, an example in which the electron transport layer 3 is a GaN layer and the electron supply layer 4 is made of AlGaN was described, but as long as the Al composition of the electron transport layer 3 is different from that of the electron supply layer 4, other combinations are possible. Also, as described above, the electron supply layer 4 may have an AlN layer at the boundary thereof with the electron transport layer 3. The combination of the electron supply layer (portions other than the AlN layer, if an AlN layer is provided at the boundary thereof)/electron transport layer may be any one of the following: AlGaN layer/GaN layer; AlGaN layer/AlGaN layer (but with different Al compositions); AlInN layer/AlGaN layer; AlInN layer/GaN layer; AlN layer/GaN layer; and AlN layer/AlGaN layer. More generally, the electron supply layer (portions other than the AlN layer, if an AlN layer is provided at the boundary thereof) includes Al and N in its composition. The electron transport layer includes Ga and N in the composition thereof, and the Al composition thereof differs from that of the electron supply layer. By having a different Al composition between the electron supply layer and the electron transport layer, lattice mismatch occurs therebetween, and as a result, carriers resulting from polarization contribute to the formation of the two dimensional electron gas.

Also, in the embodiments above, silicon was described as an example of a material for the substrate 1, but besides this, an appropriate substrate material such as a sapphire substrate or a GaN substrate can be used.

Besides these, various modifications in design can be made within the scope of the claims.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A nitride semiconductor device, comprising:
   an electron transport layer made of a nitride semiconductor;
   an electron supply layer layered on the electron transport layer, the electron supply layer being made of a nitride semiconductor including Al and having an Al composition different from that of the electron transport layer;
   a source electrode and a drain electrode disposed on the electron supply layer with a gap therebetween;
   a gate insulating film covering a surface of the electron supply layer between the source and the drain electrode;
   a mpassivation film covering a surface of the gate insulating film and having an opening between the source electrode and the drain electrode, the opening being at a distance from the source electrode and the drain electrode; and a gate electrode disposed in the opening in the passivation film and in contact with the gate insulating film, the gate electrode having a main gate body facing the electron supply layer through the gate insulating film,
   wherein the gate insulating film is a multilayer gate insulating film including a first insulating layer in contact with the electron supply layer, and a second insulating layer layered onto the first insulating layer at least under a lowest bottom surface of the main gate body of the gate electrode,
   wherein a first portion of the first insulating layer is disposed directly under, and in contact with, a first bottom surface of the source electrode and a second portion of the insulating layer is disposed directly under and in contact with a first bottom surface of the drain electrode and a second bottom surface of the source electrode and a second bottom surface of the drain electrode are in contact with the electron supply layer, respectively, and
   wherein portions of the second insulating layer are disposed on portions of top surfaces of the source electrode and the drain electrode, respectively.

2. The nitride semiconductor device according to claim 1, wherein the first insulating layer has N, and the second insulating layer is made of a metal oxide including Al, Y, Hf, Ta, Nb, or a trivalent lanthanoid metal.

3. The nitride semiconductor device according to claim 2, wherein the first insulating layer is an insulating layer made of Si and N.

4. The nitride semiconductor device according to claim 2, wherein the second insulating layer is an insulating layer made of Al and O.

5. The nitride semiconductor device according to claim 1, wherein a thickness of the gate insulating film is between 1 nm and 20 nm inclusive.

6. The nitride semiconductor device according to claim 1, wherein the electron supply layer includes a cap layer made of a nitride semiconductor with the same composition as the electron transport layer, with the source electrode, the drain electrode, and the gate insulating film disposed so as to be in contact with the cap layer.

7. The nitride semiconductor device according to claim 6, wherein a thickness of the cap layer is 16 nm or less.

8. The nitride semiconductor device according to claim 1, wherein the gate electrode further includes a field plate that is continuous to the main gate body and that extends towards the drain electrode on a surface of the passivation film outside of the opening, the field plate having a prescribed field plate length.

9. The nitride semiconductor device according to claim 8, wherein the field plate length is between $1/6$ and $1/2$ inclusive of a distance between the main gate body and the drain electrode.

10. The nitride semiconductor device according to claim 1, wherein the electron supply layer includes an AlGaN layer having an Al composition of between 13% and 30% inclusive, and having a thickness of between 5 nm and 30 nm inclusive.

11. A manufacturing method for a nitride semiconductor device, comprising:
    forming an electron transport layer made of a nitride semiconductor;
    forming an electron supply layer on the electron transport layer, the electron supply layer being made of a nitride semiconductor including Al and having an Al composition different from that of the electron transport layer;
    forming a first insulating layer on the electron supply layer;
    thereafter, forming a source electrode and a drain electrode with a gap therebetween such that a first portion of the first insulating layer is disposed directly under, and in contact with, a first bottom surface of the source electrode and a second portion of the insulating layer is disposed directly under and in contact with a first bottom surface of the drain electrode, and a second bottom surface of the source electrode and a second bottom surface of the drain electrode being in contact with the electron supply layer, respectively;
    thereafter, forming a second insulating layer on the first insulating layer so that portions of the second insulating layer are disposed on portions of top surfaces of the source electrode and the drain electrode, respectively, the first and second insulating layers together constituting a gate insulating film;
    forming a passivation film on the gate insulating film;
    forming an opening in the passivation film between the source electrode and the drain electrode, at a distance from the source electrode and the drain electrode; and
    forming a gate electrode in the opening in the passivation film so as to be in contact with the gate insulating film, the gate electrode having a main gate body facing the electron supply layer through the gate insulating film, wherein the gate insulating film under a lowest bottom surface of the main gate body is a multilayer gate insulating film including the first insulating layer in contact with the electron supply layer and the second insulating layer layered onto the first insulating layer.

12. The manufacturing method for a nitride semiconductor device according to claim 11, wherein the step of forming an opening in the passivation film includes etching, using the gate insulating film as an etching stopper.

13. The manufacturing method for a nitride semiconductor device according to claim 11, wherein the first insulating layer has N, and the second insulating layer is made of a metal oxide including Al, Y, Hf, Ta, Nb, or a trivalent lanthanoid metal.

14. The manufacturing method for a nitride semiconductor device according to claim 13, wherein the first insulating layer is an insulating layer made of Si and N.

15. The manufacturing method for a nitride semiconductor device according to claim 13, wherein the second insulating layer is an insulating layer made of Al and O.

16. The manufacturing method for a nitride semiconductor device according to claim 11, wherein the step of forming an electron supply layer includes forming a cap layer made of a nitride semiconductor with the same composition as the electron transport layer, with the source electrode, the drain electrode, and the gate insulating film formed so as to be in contact with the cap layer.

17. The manufacturing method for a nitride semiconductor device according to claim 11, wherein the gate electrode is formed so as to include a field plate that is continuous to the main gate body and that extends towards the drain electrode on a surface of the passivation film outside of the opening, the field plate having a prescribed field plate length.

18. The nitride semiconductor device according to claim 1, wherein said portions of the second insulating layer are disposed on portions of highest top surfaces of the source electrode and the drain electrode, respectively.

19. The manufacturing method for a semiconductor device according to claim 11, wherein in the step of forming the second insulating layer, said portions of the second insulating layer are disposed on portions of highest top surfaces of the source electrode and the drain electrode, respectively.

* * * * *